US010555407B2

(12) United States Patent
Polyakov et al.

(10) Patent No.: US 10,555,407 B2
(45) Date of Patent: Feb. 4, 2020

(54) METROLOGY METHODS, RADIATION SOURCE, METROLOGY APPARATUS AND DEVICE MANUFACTURING METHOD

(71) Applicant: ASML Netherlands B.V., Veldhoven (NL)

(72) Inventors: Alexey Olegovich Polyakov, Veldhoven (NL); Richard Quintanilha, Eindhoven (NL); Vadim Yevgenyevich Banine, Deurne (NL); Coen Adrianus Verschuren, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/388,519

(22) Filed: Apr. 18, 2019

(65) Prior Publication Data
US 2019/0246480 A1 Aug. 8, 2019

Related U.S. Application Data

(63) Continuation of application No. 15/747,499, filed as application No. PCT/EP2016/068479 on Aug. 3, 2016, now Pat. No. 10,342,108.

(30) Foreign Application Priority Data

Aug. 12, 2015 (EP) .................................... 15180740

(51) Int. Cl.
H05G 2/00 (2006.01)
G03F 7/20 (2006.01)
(Continued)

(52) U.S. Cl.
CPC ................. H05G 2/00 (2013.01); G03F 1/84 (2013.01); G03F 7/7065 (2013.01);
(Continued)

(58) Field of Classification Search
CPC ............. G03F 7/70625; G03F 7/70633; G03F 7/7085; G03F 1/84; H01L 22/12; G21K 1/06; H05G 2/00
See application file for complete search history.

(56) References Cited

U.S. PATENT DOCUMENTS

| 5,247,562 A | 9/1993 | Steinbach |
| 6,549,608 B1 | 4/2003 | Mamine et al. |

(Continued)

FOREIGN PATENT DOCUMENTS

| DE | 10 2011 082821 A1 | 10/2012 |
| JP | 2002-139758 A | 5/2002 |

(Continued)

OTHER PUBLICATIONS

International Search Report and Written Opinion of the International Searching Authority directed to related International Patent Application No. PCT/EP2016/068479, dated Nov. 24, 2016; 11 pages.

(Continued)

Primary Examiner — David P Porta
Assistant Examiner — Fani Boosalis
(74) Attorney, Agent, or Firm — Sterne, Kessler, Goldstein & Fox P.L.L.C.

(57) ABSTRACT

A target structure (T) made by lithography or used in lithography is inspected by irradiating the structure at least a first time with EUV radiation (304) generated by inverse Compton scattering. Radiation (308) scattered by the target structure in reflection or transmission is detected (312) and properties of the target structure are calculated by a processor (340) based on the detected scattered radiation. The radiation may have a first wavelength in the EUV range of 0.1 nm to 125 nm. Using the same source and controlling an electron energy, the structure may be irradiated multiple (Continued)

times with different wavelengths within the EUV range, and/or with shorter (x-ray) wavelengths and/or with longer (UV, visible) wavelengths. By rapid switching of electron energy in the inverse Compton scattering source, irradiation at different wavelengths can be performed several times per second.

23 Claims, 7 Drawing Sheets

(51) Int. Cl.
  *G03F 1/84* (2012.01)
  *H01L 21/66* (2006.01)
  *G21K 1/06* (2006.01)
(52) U.S. Cl.
  CPC ........ *G03F 7/7085* (2013.01); *G03F 7/70625* (2013.01); *G03F 7/70633* (2013.01); *H01L 22/12* (2013.01); *G21K 1/06* (2013.01)

(56) References Cited

U.S. PATENT DOCUMENTS

| | | |
|---|---|---|
| 7,382,861 B2 | 6/2008 | Madey et al. |
| 7,920,676 B2 | 4/2011 | Yun et al. |
| 10,342,108 B2 | 7/2019 | Polyakov et al. |
| 2008/0073572 A1 | 3/2008 | Schwarzl et al. |
| 2012/0177181 A1 | 7/2012 | Kuwabara |
| 2014/0191654 A1 | 7/2014 | Tantawi et al. |
| 2015/0285749 A1 | 10/2015 | Moncton et al. |
| 2016/0266056 A1 | 9/2016 | Ruth et al. |
| 2018/0220518 A1 | 8/2018 | Polyakov et al. |

FOREIGN PATENT DOCUMENTS

| | | |
|---|---|---|
| JP | 2002-280200 A | 9/2002 |
| JP | 4822267 B2 | 11/2011 |
| JP | 2012-117830 A | 6/2012 |
| JP | 2013-171630 A | 9/2013 |

OTHER PUBLICATIONS

International Preliminary Report on Patentability directed to related International Patent Application No. PCT/EP2016/068479, dated Feb. 13, 2008; 7 pages.

Schill Jr. et al., "Theoretical study of linear accelerator used as a VUV/X-ray source using the inverse Compton scattering mechanism: comparisions and applications," Laser and Particle Beams, vol. 15, No. 1, 1997; pp. 179-196.

Graves et al., "Compact x-ray source based on burst-mode inverse Compton scattering at 100 kHz," Physical Review Special Topics—Accelerators and Beams, vol. 17, No. 12, 2014, pp. 1-24.

Research Disclosure No. 623043, Feb. 16, 2016; 7 pages.

Madey et al., "Van de Graaf-based 13.5 nm inverse—Compton light source," Journal of Micro/Nanolithography, MEMS, and MOEMS, vol. 11, No. 2, 2012; pp. 1-7.

"4th generation eXtreme Ultraviolet Ultrafast Source," KMLabs Inc., Datasheet No. XUUS4, 2015; 6 pages.

"Linear particle accelerator," Wikipedia Article, last updated Apr. 12, 2015, accessed at https://en.wikipedia.org/wiki/Linear_particle_accelerator; 5 pages.

Oliva et al., "Quantitative evaluation of single-shot inline phase contrast imaging using an inverse compton x-ray source," Applied Physics Letters, vol. 97, No. 13, 2010; 3 pages.

Carlsten et al., "New source technologies and their impact on future light sources," Nuclear Instruments and Methods on Physics Research A, vol. 622, No. 3, 2010; pp. 657-668.

Zurch et al., "Apparatus and fast method for cancer cell classification based on high harmonic coherent diffraction imaging in reflection geometry," Medical Imaging 2014: Physics of Medical Imaging, SPIE—International Society for Optical Engineering, vol. 9033, No. 19, 2014; 7 pages.

Non-Final Rejection from related U.S. Appl. No. 15/747,499, filed Jan. 25, 2018, dated Jul. 10, 2018; 8 pages.

Final Rejection from related U.S. Appl. No. 15/747,499, filed Jan. 25, 2018, dated Nov. 26, 2018; 8 pages.

Notice of Allowance from related U.S. Appl. No. 15/747,499, filed Jan. 25, 2018, dated Feb. 4, 2019; 9 pages.

METROLOGY METHODS, RADIATION SOURCE, METROLOGY APPARATUS AND DEVICE MANUFACTURING METHOD

CROSS-REFERENCE TO RELATED APPLICATIONS

This application is a continuation of U.S. patent application Ser. No. 15/747,499, filed Jan. 25, 2018, which is a National Stage Entry of international Application No. PCT/EP2016/068479, filed Aug. 3, 2016, which claims priority of European Application No. 15180740.1, filed on Aug. 12, 2015 and is incorporated herein in its entirety by reference.

FIELD OF THE INVENTION

The present invention relates to methods and apparatus for metrology usable, for example, in the manufacture of devices by lithographic techniques and to methods of manufacturing devices using lithographic techniques. Methods of measuring critical dimension (line width) are described, as a particular application of such metrology. For the purpose the present disclosure, metrology includes inspection for a wide range of purposes, including for example detection of defects, and not only to quantitative measurement of a particular dimension or material property.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon water).

In lithographic processes, it is desirable frequently to make measurements of the structures created, e.g., for process control and verification. Various tools for making such measurements are known, including scanning electron microscopes (SEM), which are often used to measure critical dimension (CD). Other specialized tools are used to measure parameters related to asymmetry. One of these parameters is overlay, the accuracy of alignment of two layers in a device. Recently, various forms of scatterometer have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis. Compared with SEM techniques, optical scatterometers can be used with much higher throughput, on a large proportion or even all of the product units.

As technology develops, however, performance specifications become ever tighter. A further limitation of current methods is that they are made with optical wavelengths, requiring dedicated metrology structures with dimensions much greater than the typical dimensions of real product features. Accordingly, the measurements made on these metrology structures are only indirectly indicative of the real product structures. A particular parameter of interest is linewidth (CD), and a suitable small-target method for CD measurement has not yet been devised.

To obtain higher resolution measurements, it has also been considered to use EUV radiation, with wavelengths in the range for example 0.1 to 125 nm. EUV radiation is particularly attractive as it has wavelengths of the same order as the structures to be measured. Spectroscopic EUV reflectometry, for example, is proposed in the European patent application number 15160786, not published at the present priority date. Unfortunately, due to limitations of radiation sources available, there is no existing technique that provides for metrology on small targets, such as an in-die grating, or product structures themselves with a speed suitable for mass measurement in high-volume manufacturing. An ideal radiation source would be compact and affordable, and have a high brightness coupled with free selection of wavelength and good ability to focus into a small target area.

A bright, compact x-ray source has recently been described based on the phenomenon of inverse Compton scattering (ICS). This is described by W S Graves et al, in "Compact x-ray source based on burst-mode inverse Compton scattering at 100 kHz", Physical Review Special Topics—Accelerators and Beams 17, 120701 (2014). The contents of the Graves et al reference and associated patent application are incorporated herein by reference. To reach high brightness on the electrons, a linear accelerator is used to the desirable high brightness for use in x-ray metrology applications. Details of a linear accelerator used in the x-ray source are provided in published patent application US2014191654A1 (Tantawi & Neilson). Other ways to accelerate the electrons are in development by other workers.

SUMMARY OF THE INVENTION

The invention aims to provide alternative methods of small target metrology, overcoming one or more of the drawbacks of the optical and X-ray methods described above. A particular desire is to measure parameters for example at locations within product areas on a semiconductor substrate, while improving the speed with which such measurements can be performed and while adapting to the smaller dimensions of features made by current and future lithographic technologies.

The inventors have recognized that a source based on inverse Compton scattering can be adapted to provide a bright and controllable source in the EUV (soft X-ray) range, to enable high-volume metrology on small targets. The same adapted source can be used to inspect other types of structures, both natural and man-made, not only semiconductor products.

The invention in a first aspect provides a method of measuring a property of a structure, the method comprising irradiating the structure at least a first time with radiation, detecting said radiation after interaction with the structure and determining a property of the structure based on a property of the radiation, wherein said radiation is generated by inverse Compton scattering, the radiation having a first wavelength in the range of 0.1 to 125 nm.

The invention further provides a radiation source apparatus based on inverse Compton scattering, the apparatus comprising an electron source and a photon source, and a controller for controlling the electron source and the photon source to deliver one or more bunches of electrons to an interaction point at the same time as a pulse of photons, whereby a proportion of the photons acquire additional energy by inverse Compton scattering to and are output by the apparatus, wherein the additional energy is controllable such that the photons output by the apparatus have a wavelength in the range 0.1 nm to 125 nm.

The inventors have recognized that a source based on inverse Compton scattering can be designed and controlled to deliver radiation of an extremely wide range of wavelengths, not only EUV wavelengths and/or x-rays. The same source, for example, may be operable to provide radiation in EUV, UV, and even visible wavelengths, and/or x-ray wavelengths, in addition to radiation at EUV wavelengths.

The invention further provides a metrology apparatus for use in measuring properties of a structure, the apparatus comprising:

a radiation source apparatus according to the invention as set forth above;

an illumination system for delivering photons output by the radiation source apparatus in a beam of radiation onto the structure; and a detection system for detecting radiation from the structure after said photons have interacted with the structure.

In a particular implementation, the apparatus is adapted to receive semiconductor wafers (for example 300 mm wafers) from an automated wafer handler. In other applications, the apparatus can be adapted for measurement of any type of structure, whether natural or man-made.

In yet another aspect, the invention provides a device manufacturing method comprising:

transferring a pattern from a patterning device onto a substrate using a lithographic process, the pattern defining at least one periodic structure;

measuring one or more properties of the periodic structure to determine a value for one or more parameters of the lithographic process; and applying a correction in subsequent operations of the lithographic process in accordance with the measured property, wherein the step of measuring the properties of the periodic structure includes measuring a property by a method according to the invention, set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
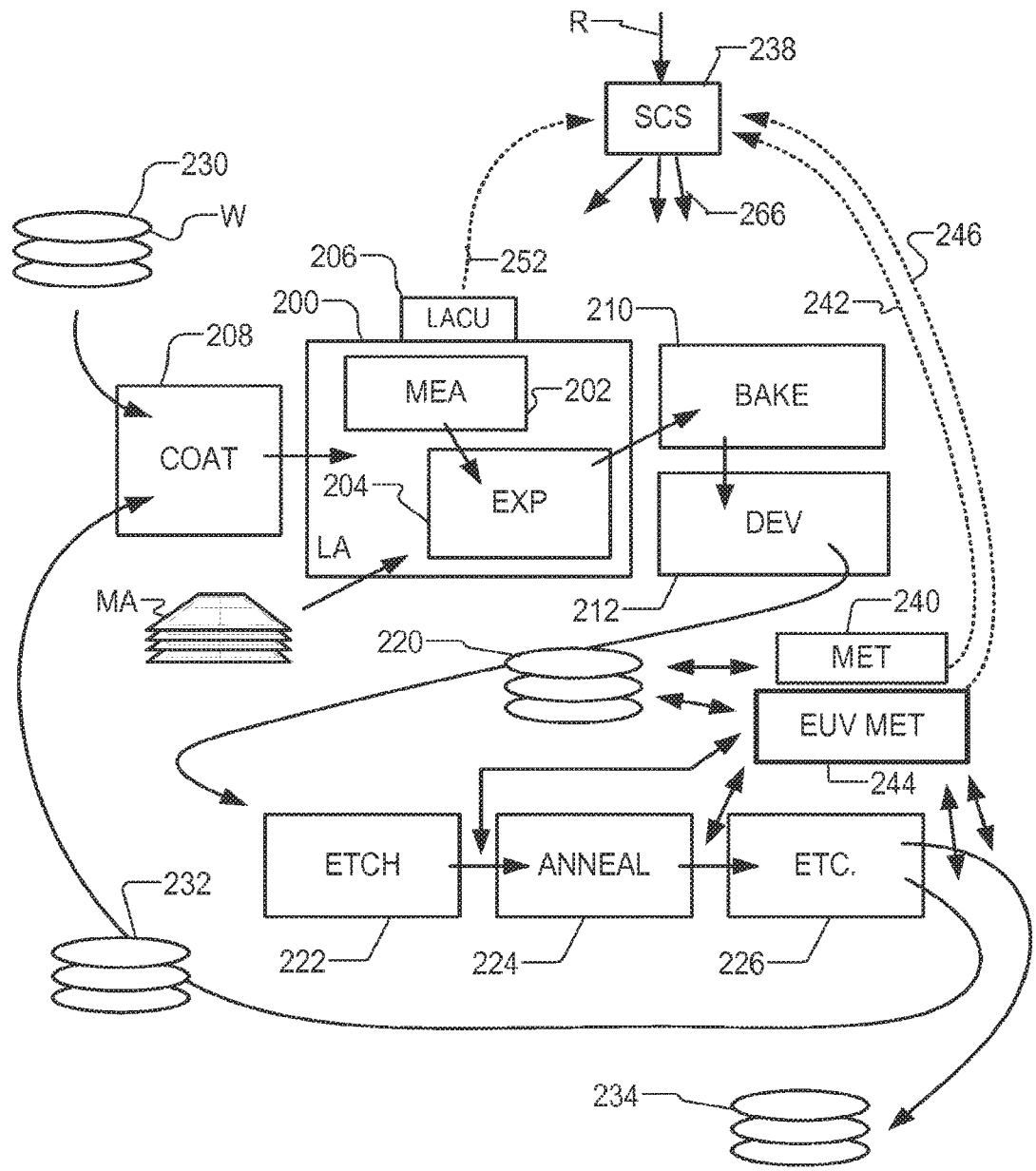
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACI) is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DIN) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system (SCS) 238, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226, A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACLJ 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Each generation of lithographic manufacturing technology (commonly referred to as a technology "node") has tighter specifications for performance parameters such as CD. One of the main challenges in metrology is that the metrology target size is desired to be smaller than the targets customarily used with metrology apparatus 240. For example, a present goal is to use targets with a size of 5 μm×5 μm or smaller. These small sizes would permit wider use of so-called "in-die" metrology, where targets are located among the product structures (instead of being confined in scribe lane areas between product areas), or "on product" metrology, where the targets are the product structures themselves. The only metrology technique currently used for on-product CD metrology is electron microscopy (CD-SEM). This known technique shows limitations for future nodes, and only provides very limited geometrical information of the structure.

One approach to improving metrology of the smallest structures is to use shorter wavelengths of radiation, for example in the extreme ultraviolet (EUV), soft x-ray or even hard x-ray ranges. For example, EUV reflectometry, including spectroscopic EUV reflectometry, may be considered as a CD-metrology method for future technological nodes. X-ray scattering techniques such as small-angle x-ray scattering may also be considered, in transmissive mode (T-SAXS) or in grazing incidence mode (GI-SAXS). Principles and practice of EUV metrology in this context are provided in the patent application EP15160786, mentioned above. There it is demonstrated that EUV reflectometry offers benefits of high sensitivity, being robust against process variations and being selective for a parameter of interest.

For the purpose of the present disclosure, hard x-rays are considered as rays with wavelength less than about 0.1 nm, for example including the range 0.01 to 0.1 nm. Soft-x-ray or EUV refers to the range extending roughly from 0.1 nm to 125 nm wavelength. Different sub-ranges of these ranges can be chosen to suit the dimensions of structures under investigation. For example, for semiconductor structures at the limits of current lithographic techniques, wavelengths in the range 0.1 to 20 nm may be considered, or 0.1 to 10 nm, or 1 to 5 nm. Not only the size of structures, but also their material properties can influence the selection of wavelengths to use in investigations. For example, to perform reflectometry, at least background material of the structure requires good reflection strength at the wavelength used. For investigation of buried features, the wavelength should be chosen to obtain sufficient penetration through overlying material.

EUV metrology can be used to measure structures within the resist material treated within the litho cell (After Develop Inspection or ADI), and/or to measure structures after they have been formed in harder material (After Etch Inspection or AEI). For example, substrates may be inspected using EUV metrology apparatus 244 after they have been processed by the developing apparatus 212, etching apparatus 222, annealing apparatus 224 and/or other apparatus 226. X-ray techniques will generally be limited to AEI, due to poor contrast in the resist material at x-ray wavelengths.

For high-volume manufacturing applications, a high brightness radiation source would be desirable, to reduce acquisition time for each measurement. The limited power of current compact x-ray sources means that known T-SAXS techniques suffer from a very low throughput, especially for small size metrology targets. This is especially the case when one seeks to obtain a very small spot size for illuminating a small target area on a substrate. Known EUV sources are also limited in brightness, and limited in selection of wavelengths. To maximize contrast in target structures and to discriminate between structures of different materials, fine control of the wavelength over a wide range would be desirable.

The manufacturing system illustrated in FIG. 1 includes one or more EUV metrology apparatuses 244 in addition to the optical scatterometer 240. This EUV metrology apparatus provides additional metrology results 246 which can be used by supervisory control system SCS to achieve further control of quality and improvement in performance of the lithographic manufacturing system as a whole. Like the optical scatterometer 240, metrology apparatus 244 can be applied at different stages in manufacture, such as ADI and AEI, mentioned above.

EUV Reflectometry Method

Figure 2:
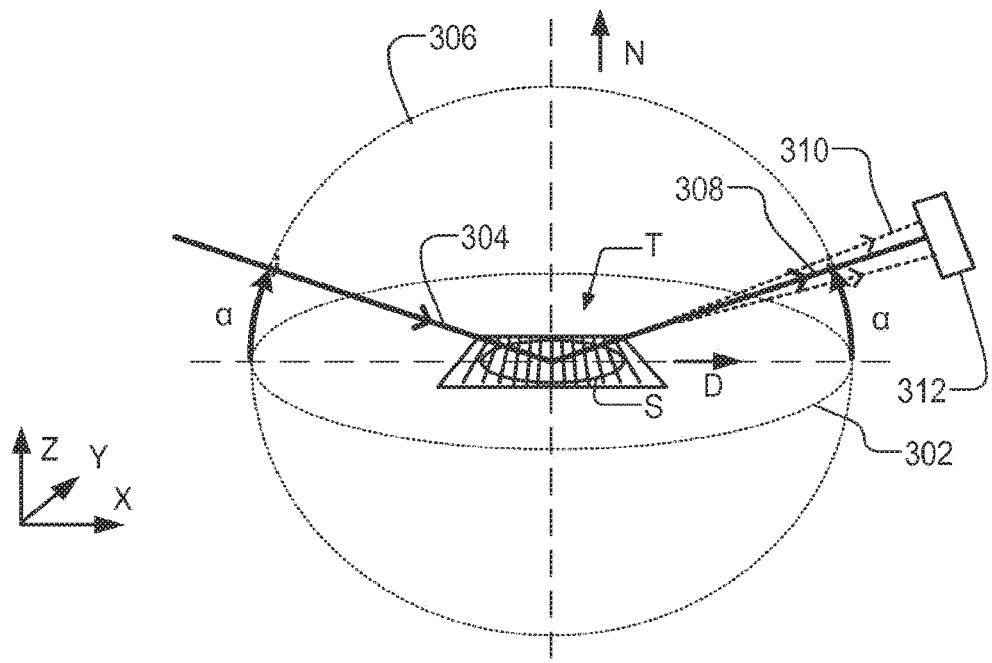
FIG. 2 illustrates the geometry of incident and reflected rays in relation to a grating target in a metrology method according to a first embodiment of the present invention.
Figure 3:
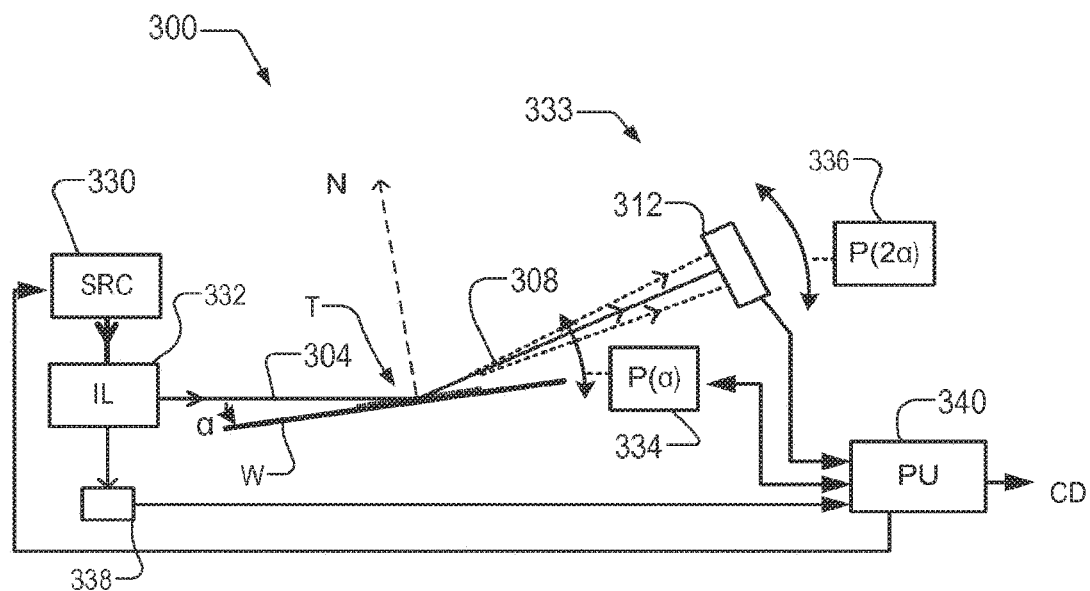
FIG. 3 illustrates schematically the components of a metrology apparatus, performing the method of FIG. 2.

FIG. 2 illustrates an metrology method while FIG. 3 illustrates an metrology apparatus 300. The apparatus can be used as an example of EUV metrology apparatus 244 for measuring parameters of substrates W processed in the manufacturing system of FIG. 1. The apparatus can be used in wavebands other than EUV, In FIG. 2, the target T is represented schematically as comprising a one-dimensional grating structure at the origin of a spherical reference frame. Axes X, Y and Z are defined relative to the target. (Of course any arbitrary coordinate system can be defined in principle, and each component may have its own local reference frame, that can be defined relative to the one shown.) The direction of periodicity D of the target structure is aligned with the X axis. The drawing is not a true perspective drawing, but a schematic illustration only. The X-Y plane is the plane of the target and substrate, and for clarity is shown tilted toward the viewer, represented by an oblique view of circle 302. The Z direction defines the direction N normal to the substrate. In FIG. 2, a ray of incident radiation is labeled 304 and has an angle α of grazing incidence. In this example, the incident ray 304 (and all incident rays forming the radiation spot S) lie substantially in a plane parallel to the X-Z plane, that is a plane defined the directions D and N and represented by circle 306. A reflected ray 308 that is not scattered by the periodic structure of the target (i.e. a ray of specular reflection) emerges towards the right hand side of the target in the diagram, with an elevation angle α.

Other rays 310 are scattered at angles different to the specular reflection, in accordance with diffraction properties of the target. The angle of separation between these rays and the specular ray will depend on the relationship between the wavelength of the radiation and the spacing of features of the target. The drawing is not to scale. For example, detector 312 may be closer to or further from the target than shown, the target grating will likely be very small relative to the detector; the angles of diffraction of rays 310 could be much wider than indicated.

To perform reflectometry, the ray 308 and/or the scattered rays 310 are captured by a photodetector 312. Detector 312 comprises for example a position-sensitive EUV detector, typically an array of detector elements. The array may be a linear array, but in practice a 2-dimensional array of elements (pixels) may be provided. Detector 313 may be for example a CCD (charge coupled device) image sensor or a CMOS image sensor. This detector is used to transform the reflected radiation into electrical signals and eventually digital data for analysis. A single pixel detector may be sufficient in principle for some types of measurement. More flexibility of operation will be allowed by having a two-dimensional image detector.

From the measured spectrum, obtained for one or more wavelengths and one or more values of incidence angle α, a measurement of a property of the target structure T can be calculated in a manner described further below.

EUV Reflectometry Apparatus

Turning to FIG. 3, metrology apparatus 300 is provided for measuring properties of a metrology target T formed on substrate W, by the method of FIG. 2. Various hardware components are represented schematically. The practical implementation of these components can be performed by the relevant skilled persons applying a mixture of existing components and specially-designed components, according to well-known design principles. A support (not shown in detail) is provided for holding the substrate at a desired position and orientation relative to other components to be described. A radiation source 330 provides radiation to an illumination system 332. Illumination system 332 provides a beam of radiation represented by ray 304 which (together with other rays forming an illuminating beam) forms a focused irradiation spot on target T. Detector 312 and any ancillary optical components may be conveniently considered as a detection system 333.

Substrate W in this example is mounted on a movable support having a positioning system 334 such that an angle of incidence a of ray 304 can be adjusted. In this example, it is chosen as a matter of convenience to tilt the substrate W to change the incidence angle, while the source 330 and illumination system 332 remain stationary. In order to catch the reflected ray 308, detection system 333 is provided with a further movable support 336, so that it moves through an angle 2a relative to the stationary illumination system, or through an angle α relative to the substrate. In the grazing incidence regime of reflectometry, it is convenient to define the incidence angle α by reference to the plane of the substrate, as shown. Of course, it could equally be defined as an angle between the direction of incidence of incident ray 304 and a direction N normal to the substrate.

In alternative embodiments, the angle of incidence can be varied in more than one dimension, for example by use of a conical mount. This type of arrangement and its potential benefits are described in detail in the European patent application number 15160786, mentioned above. The entire contents of that application are incorporated herein by reference.

Additional actuators, not shown, are provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detector stay still, or whether the substrate stays still while the illumination system and detector are moved, or whether different components of the relative movement are achieved by a combination of these techniques. The present disclosure encompasses all these variants.

As already described with reference to FIG. 2, the radiation reflected by target T and substrate W is split into a spectrum 310 of rays of different wavelengths, before it impinges on detector 312. A second detector 338 will normally also be provided for measuring intensity of the incident beam, for use as a reference. A processor 340 receives signals from the detectors 312 and 338. The resulting reflection data for one or more angles of incidence are used in the processor to calculate a measurement of property of the target, for example CD or overlay.

Inverse Compton Scattering Radiation Source

Figure 4:
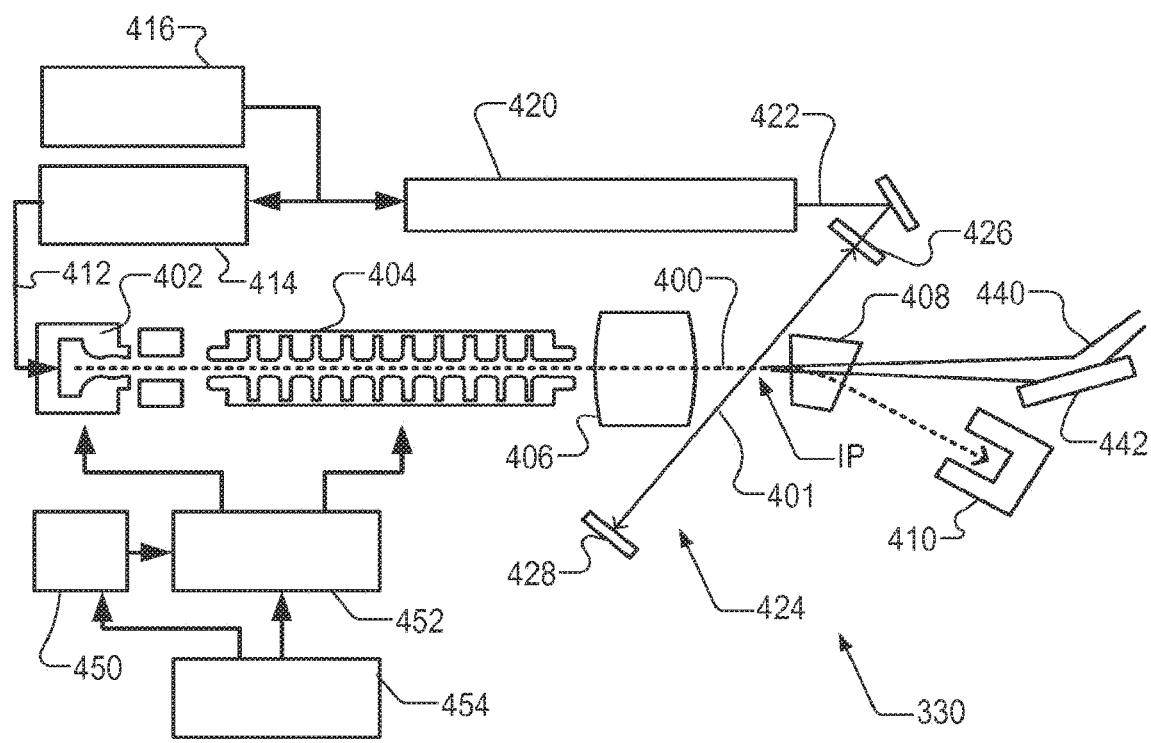
FIG. 4 shows schematically the construction of a radiation source used in the apparatus of FIG. 3.

FIG. 4 is a schematic block diagram of the radiation source 330 in the apparatus of FIG. 3. To provide metrology apparatus 300 that can be used in the semiconductor industry as a primary metrology tool with high throughput and/or high density of measurements per wafer, a very bright source is desirable. For inspection of product structures in EUV, a wavelength range around 13 nm is relevant, similar to the wavelength used for EUV imaging in the latest lithographic apparatus. However, in this wavelength range, compact high brightness sources are not available on the market today. The inventors have identified that a source based on Inverse Compton Scattering (ICS) can be developed into a source suitable for use as source 330 in the apparatus 300. An ICS-based source is expected to be able to provide the high brightness needed in EUV range for scatterometry and reflectometry of different kinds. The same or a similar source can also provide radiation in the X-ray range for GI-SAXS or T-SAXS applications. A tunable source in the range of, for example, 0.01 nm to 125 nm with high brightness can be envisaged. This would be beneficial for scatterometry (fixed angle, or combined with angular scan). If the source produces radiation with a certain level of spatial coherence, it can also be used for so-called lensless imaging techniques (coherent diffraction imaging (CDI), including for example techniques known as ankylography and ptychography).

Radiation source 330 in this example is based around interaction between a high energy electron beam 400 and laser radiation 401. A brief description of the main components and operation will be provided here. For more detail of the implementation of an ICS source, reference is made to W S Graves et al, "Compact x-ray source based on burst-mode inverse Compton scattering at 100 kHz", Physical Review Special Topics—Accelerators and Beams 17, 120701 (2014), The contents of the Graves et al reference are incorporated herein by reference.

Components associated with the electron beam are a radio frequency (RF) electron gun 402, a linear accelerator (linac) 404, a focusing assembly 406, a beam deflector 408 and an electron dump 410. Electron gun 402 contains a photocathode and accelerator, so that bunches of electrons can be emitted into linac 404 when triggered by optical pulses 412 from a photocathode laser 414. Focusing assembly 406 may for example comprise a set of quadrupole electromagnets. Deflector 408 may comprise a dipole electromagnet.

A seed laser 416 provides pulses of seed radiation to photocathode laser 414. In the example described by Graves et al, these are pulses of 1030 nm wavelength, with a pulse frequency of 200 Mhz. Photocathode laser 414 in operation selects groups of pulses, amplifies them optically, and converts them by fourth harmonic generation to pulses of approximately 250 nm wavelength. These pulses are the ones delivered to the photocathode to generate electron bunches. Pulses may be selected for example with a frequency of 100 kHz, 100 pulses per group, and 1000 groups per second. Linac 404 accelerates the electrons to an energy in the range, for example, 8 MeV to 40 MeV. Electron beam 400 is thus generated and delivered with a well-defined energy per electron, to interaction point IP. The beam is focused to its narrowest point at the interaction point labeled IP. After passing the interaction point, deflector 408 steers the electron beam to an electron dump 410.

Laser beam 401 is generated by ICS laser 420. This, too, is seeded by pulses picked from the output of seed laser 416. Pulses are taken at 1 kHz, amplified and compressed to generate pulses of 3 picosecond pulse length at 1 kHz, with wavelength 1030 nm. An output beam 422 of ICS laser 420 is delivered into an optical cavity 424 formed between two mirrors 426, 428. An enlarged detail of the optical cavity and the interaction point is shown in FIG. 5.

Figure 5:
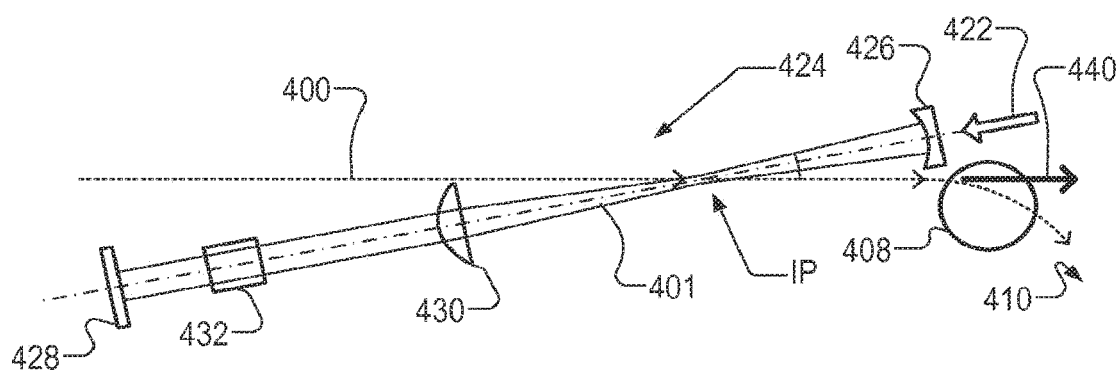
FIG. 5 shows in more detail a part of the radiation source of FIG. 4.

Referring to FIGS. 4 and 5 together, mirror 426 at the input end of the cavity is a dichroic mirror, so as to pass certain wavelengths and reflect others. Mirror 428 is a totally reflecting mirror. Cavity 424 also contains a lens 430 and a harmonic generator 432. Harmonic generator 432, for example a crystal of lithium triborate (LBO) or barium borate (BBO), converts a proportion of the incoming photons in beam 422 to a wavelength of 515 nm, by frequency doubling (second harmonic generation). By the action of dichroic mirror 426, these photons are trapped in the cavity, to form the beam 401 that interacts with the electron beam 400. Mirror 426 is also curved to provide a focusing function. Lens 430 and mirror 426 focus the trapped laser beam 401 so as to define a beam waist at the desired interaction point IP. In the practical example, the laser beam 410 is aligned as closely as possible to the direction of the electron beam 400, while still avoiding interference between the electron beam and the laser optics. Graves et al use an angle of 50 mrad (millirad), for example. The angle is exaggerated in the drawings, which are not to scale.

By these means, it is arranged that a train of 100 electron bunches arrive at the interaction point IP 100 times per second, at the same time as a pulse of intense laser radiation is present. Inelastic scattering between the electrons and the photons in the two beams transfers additional energy to the photons, so that a proportion of them achieve the desired frequency to generate a desired output beam 440 of photons having the desired wavelength for use in the metrology method of FIG. 2. Output beam 440 has a relatively small divergence of, for example 10 mrad, and a reflective focusing optic 442 is provided to focus the output beam to the desired radiation spot S. In that regard, focusing optic 442 may be regarded forms part of the illumination system 332 of FIG. 3, and/or as part of the source 330. For use at EUV wavelengths, in the present example, optic 42 may comprise a multilayer mirror, or a simple metal mirror of for example Au or Ru metal. Focusing optic 442 can also serve as a beam splitter, to provide reference illumination to the detector 338 (not shown in FIG. 4). Beam splitting can be performed for example by a grating structure integrated in the focusing optic. Beam splitting can be performed by a separate element, if preferred.

Returning to the generation of electron beam 400, electric power for the generation of the electron beam 400 is provided at radio frequency by a klystron 450 and waveguide system 452. The voltage and current of these are controlled by a control system 454. The voltage on the linac determines the acceleration and final energy of the electrons in beam 400. This directly influences the energy imparted to the laser photons, and hence determines the wavelength of the radiation forming output beam 440. In the example of Graves et al, an x-ray source is desired and photons with energy 12.4 keV are produced, corresponding to a wavelength around 0.1 nm in the x-ray band. Such an x-ray source can be useful in semiconductor metrology, but only in grazing incidence. The source may be usable for example for T-SAXS and may be more suited to high volume measurements than conventional plasma sources (which are not as bright) or synchrotron sources (which are too large and expensive). However, x-rays in grazing incidence are not really suitable for investigating surface structures within a small localized area on a wafer. With an energy of 13 keV or more, the x-rays can be used in transmission through a silicon wafer. The present inventors have further recognized that the ICS source, while designed for generating hard x-rays, can be adapted and adjusted to produce lower energy photons (longer wavelengths), simply by lowering the energy of the electrons. In the present example, this is achieved by reducing the voltages supplied to the linac, which can be done very quickly by suitable design of the control system 454 and other components. Equivalent steps to adjust the electron energy can be applied instead of or in addition to varying the linac voltage, or in the case of sources not using a linac.

The source 330 can therefore be used to produced soft x-ray or EUV radiation with high brightness, instead of or as an alternative to "hard" x-rays. If the source can also be adjusted to produce hard x-rays, that will be a bonus. For the primary purpose envisaged herein, EUV radiation can be produced for example in an energy (wavelength) range that includes 1 keV (around 1.2 nm), 0.1 keV (12.4 nm) and even 0.01 keV (124 nm). These wavelengths, which also correspond with the dimensions of the product features whose parameters are to be measured, permit large incidence angles and therefore finer focused spots.

Additionally, while conventional plasma sources are very variable in brightness over the EUV spectrum, the ICS source described here can be tuned to virtually any desired frequency in the band of interest, by suitable control of the voltage and or other parameters around the electron gun and the linac. Not only can the wavelength be changed from measurement to measurement, but it can also be changed within a measurement, for example to obtain "spectroscopic" information.

Furthermore, by reducing the electron energy further and further, the same source may in principle operate at even longer wavelengths, into so-called VUV (100-200 nm or 125-200 nm, for example) and UV (200-350 nm), and even visible (400-800 nm) wave bands. The reflective optic 442, while effective at EUV wavelengths, can serve equally to focus radiation up to the visible wavelength range. The ICS source would be excessively complicated and expensive, if one only wanted a source of UV or visible radiation. However, to have a single source and optical system operable to produce such a wide variety of wavelengths, substantially by electronic control changes only, allows new flexibility in the metrology apparatus 300. Such an apparatus can be useful not only in semiconductor manufacturing, but in a wide range of applications of scientific investigation and/or quality control applications.

Optical system for EUV Reflectometry

Example applications of this source 330 include EUV reflectometry, using an apparatus such as the one illustrated in FIG. 3. In the application of this EUV-SR to metrology in semiconductor manufacturing, small grating targets can be used. Multiple diffraction spectra are captured using detector 312, while setting the grazing angle of incidence a to various different values. Using the detected spectra and a mathematical model of the target structure, reconstruction calculations can be performed to arrive at measurement of CD and/or other parameters of interest. An example reconstruction method will be illustrated further below.

Considering the target illustrated in FIG. 2 as an example, dimensions of the lines and spaces will depend on the target design, but the period of the structure may be for example less than 100 nm, less than 50 nm, less than 20 nm, even less than 10 nm and down to 5 nm. The lines of the grating structure may be of the same dimension and pitch as product features in a product area of the substrate. The lines of the grating structure may in fact be the lines of a product structure, rather than a target structure formed, within a dedicated target area, solely for the purposes of metrology. Such small features may be formed for example in an EUV lithography process, by imprint lithography or by direct-write methods. Such small features may also be formed using present-day INN lithography, by a so-called double-patterning processes (generally multiple-patterning). Techniques in this category include pitch-doubling, for example by litho-etch-litho-etch (LELE) and self-aligned dual-damascene in back end-of the line (BEOL) layers. For the purposes of explanation, it will be assumed in the following examples that CD is the parameter of interest. However, where there are two gratings formed on top of one another, another parameter of interest maybe overlay. This can be measured based on asymmetry in the EUV-SR diffraction orders, as described separately below. The incidence angle can be elevated if necessary to achieve adequate penetration to the lower structure.

In the multiple-patterning process, structures are formed in one layer of the product not in one patterning operation but in two or more patterning steps. Thus, for example, a first population of structures may be interleaved with a second population of structures, and the populations are formed in different steps, so as to achieve a higher resolution than one step alone can produce. While the placement of the populations should be identical and perfect in relation to other features on the substrate, of course every real pattern exhibits a certain positional offset. Any unintentional positional offset between the populations can be regarded as a form of overlay, and can be measured by analogous techniques to those used to measure overlay between layers. Additionally, overlay against features in an underlying or overlying layer can be different for each population when multiple populations of features are formed in a single layer, and overlay for each of these populations can be measured separately if desired.

Figure 6A:
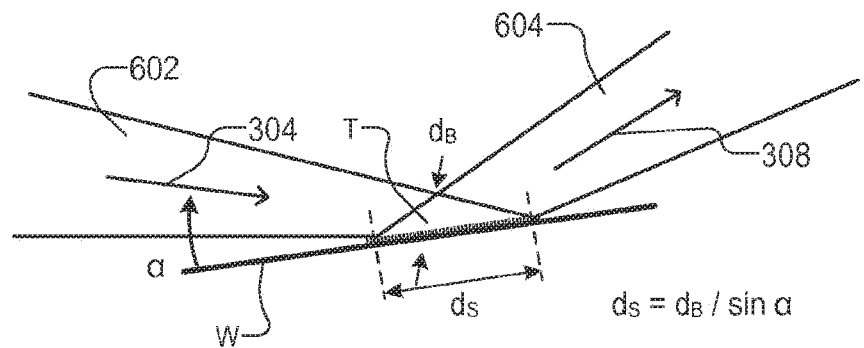
FIG. 6 (a) illustrates by a schematic side view the elongation of a spot of radiation under grazing incidence, with schematic representations of beam cross-section B an spot S shown schematically at FIG. 6(b) and FIG. 6(c) for different angles of incidence.

FIG. 6 illustrates the variation of elongation of a radiation spot, which can be challenging for implementation of in-die metrology using grazing incidence reflectometry. In FIG. 6(a), the substrate W and target T are shown in cross-section. Representative incident ray 304 and reflected ray 308 are illustrated, with incidence angle α relative to substrate W. As these are representative rays, it should be considered that the incident radiation as a whole comprises many rays, which form a beam indicated schematically at 602. Similarly, the reflected radiation comprises many rays 308 which form a beam indicated schematically at 604. In order to make use of the smallest possible target, a radiation spot is formed by focusing the rays of the beam 602, so that they converge to define a minimum beam diameter precisely where they meet the surface of substrate W. In the illustration, the incident beam 602 is convergent to a focus with a minimum diameter $d_B$. The reflected beam 408 (ignoring scattering effects) comprises divergent rays, as shown. Because grazing incidence angle α is relatively small (in other words, nearer to zero than to 90°) the diameter $d_S$ of the radiation beam 602, as projected on to the target T, is several times greater than the beam diameter $d_B$. The ratio between diameters $d_S$ and $d_B$ depends on the sine of angle α as shown in FIG. 4(a).

Figure 6B:
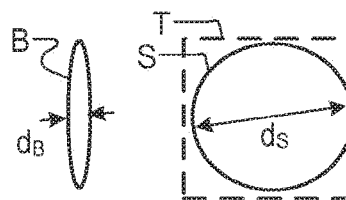
Figure 6C:
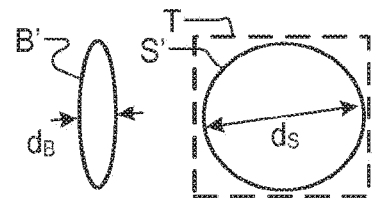

As shown in FIG. 6(b), to achieve circular spot S that fits within the area of target T, the beam 602 should have the strongly elliptical cross section shown at B. When the angle α is 5°, for example, the minimum diameter $d_B$ of the beam should be more than ten times smaller than the allowable diameter of the spot $d_S$ (sin 5°=0.087). For lower angles of incidence, the minimum diameter of the beam would have to be tens, hundreds or even thousands of times smaller. To obtain a spot that fits within a small target area such as 5 µm square would be impossible in practice. Even at α=5°, the minimum beam diameter $d_B$ should be around 436 nm to achieve a spot size under 5 µm. Conversely, as seen in FIG. 6(c), an increase in the grazing incidence angle α greatly relaxes the minimum diameter requirement of the beam 404. The ellipse B' can be much broader than the ellipse B, in order to achieve a spot S' that fits within the area of target T. For example, for α=20°, the beam diameter will be increased only by a factor of three. The minimum diameter $d_B$ can be as large as 1.7 µm without exceeding the 5 µm spot size.

Compared with known techniques, particularly X-ray reflectometry (GI-XRS), the use of EUV wavelengths in the range 1 to 100 nm allows these higher incidence angles and can bring smaller spot sizes within the capability of EUV optical design. This capability of the source 330 described above enables EUV reflectometry to be considered for measuring small targets on substrates in high volume manufacturing.

Figure 7:
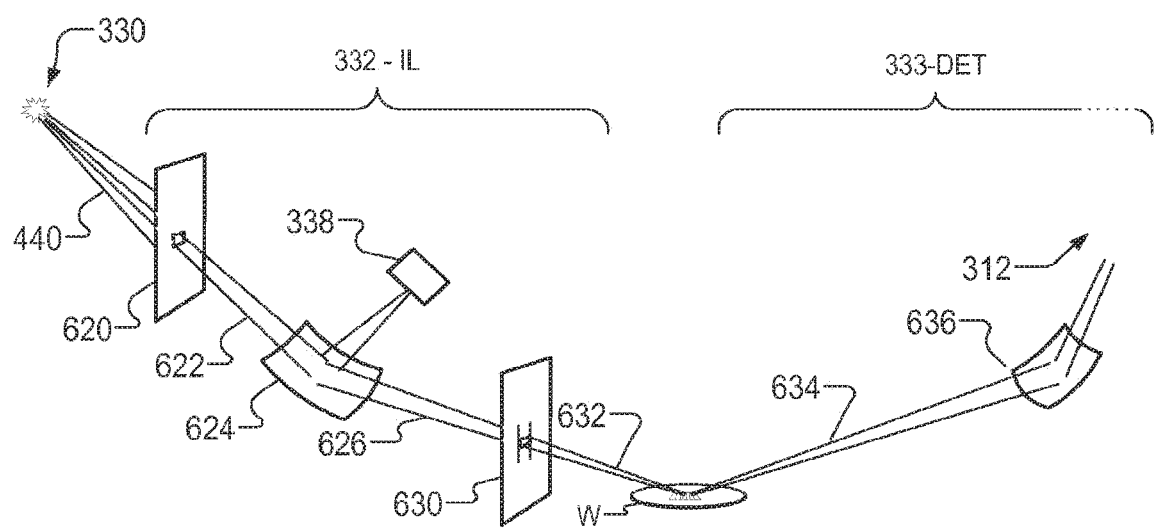
FIG. 7 illustrates schematically the components of an illumination system in one embodiment of the apparatus of FIG. 3.

FIG. 7 illustrates one possible arrangement of the illumination system 332 in the apparatus of FIG. 3, and part of detection system 333 also. Radiation source 330 based on inverse Compton scattering produces radiation in a well-defined beam 440 of radiation, as described above with reference to FIGS. 4 and 5. Some or all of the elements of the optical system shown may be omitted if unnecessary to achieve a desired performance with this source.

Beam 440 of EUV radiation having a desired wavelength is received with a certain divergence. At the exit of the source 330 (the entrance to the illumination system 332), a first aperture 620 is provided to serve as an entrance pupil for the illumination system. An incoming beam 622 with lesser divergence impinges on a focusing optical element or system. This focusing system is implemented in the present illustration by a 2-dimensionally curved mirror 624, for example an ellipsoidal mirror. Mirror 624 produces a convergent beam 626, which is focused to form the spot at the target location on substrate W. Optionally, a second aperture 630 is provided to restrict the diameter of beam 632 at the target. In particular, aperture 630 may be made adjustable in height and/or width so that different shapes of beam B' can be generated according to different desires/sizes, and different incidence angles α. It will be understood that curved mirror 624 corresponds to the focusing optic 442 shown in FIG. 4.

Reflected beam 634 enters detection system 332, carrying information about the structure of the target to detector 312 (not shown in this view). Optionally, a second focusing mirror 636 is provided to reduce divergence of the beam, as it enters detection system 333. Either of the two-dimensionally curved mirrors 624, 636 could be replaced by a series of two or more one-dimensionally curved (cylindrical) mirrors. As illustrated, mirror 624 can also serve as a beam splitter, to provide reference illumination to the detector 338. Beam splitting can be performed for example by a grating structure integrated in the mirror. Other variations in the optical system are of course possible, without departing from the principles of the present disclosure.

Wavelength Selection

The ability to make measurements at different wavelengths can greatly increase information diversity which aids processor PU to measure accurately nanostructure using methods such as optical scatterometry. It is possible with the ICS source to select the wavelength and set it up close to or at absorption edge of a specific material enabling the possibility to do material dependent scatteromeuy or imaging, for instance.

Figure 8:
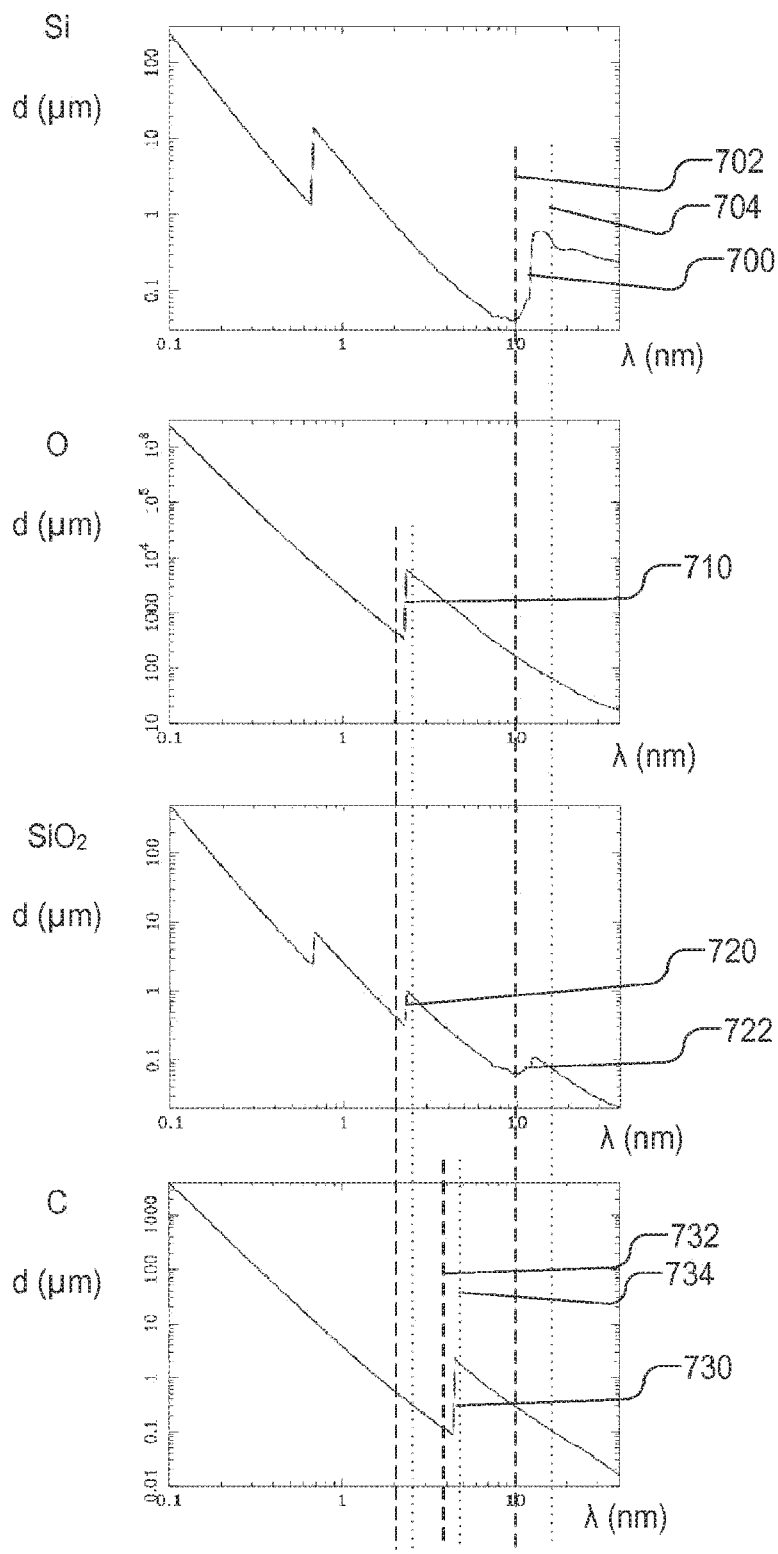
FIG. 8 illustrates variations of absorption for different materials over a range of wavelengths within part of the EUV spectrum.

FIG. 8 illustrates the interaction of radiation of different wavelengths with various materials, which are just a selection of those encountered in a typical semiconductor product. In four graphs the horizontal axis represents wavelength λ on a logarithmic scale, running from 0.1 nm to 40 nm, just for the sake of example. As mentioned already, these wavelengths encompass the dimensions of the features of interest, and the resolution of measurement desired. The vertical axis in each graph represents penetration depth (attenuation length) in μm, or a material of given density. The absolute scale is not relevant, but what can be seen is that each material exhibits strong differences in attenuation at wavelengths either side of certain "edges", and that these edges fall at different wavelengths for different elements and compounds.

For example, in the top graph, silicon Si exhibits a strong edge 700 at around 12.4 nm. Measurements at the wavelength 702 are relatively sensitive to the presence of silicon, while measurements at the wavelength 704 are relatively insensitive. In the second graph, oxygen exhibits a different edge 710 and in the third graph the oxide $SiO_2$ exhibits edges 720, 722 corresponding to both Si and O components. Carbon in the fourth graph has an edge 730 at yet another wavelength. Accordingly, it will be seen that a resist structure (high in carbon) can be measured more accurately by selecting wavelength 732, rather than some arbitrary wavelength. For further accuracy, at the expense of an additional illumination and detection step, differential measurements can be obtained by detecting a scatter patterns or reflectances at wavelengths 732 and 734, either side of the edge 730. Similar differential pairs of wavelengths are illustrated either side of the edges 700 and 710. The same measurement strategy is applied to Ge, for example.

An application of an ICS source, which takes advantage of the tunability of the emitted illumination's wavelength, is a metrology application where wavelengths from visible to EUV ranges are used to provide information about parameters of a lithographic process, whereas wavelengths produced by ICS source, shorter than typical EUV wavelengths, are used for measurements related to characterizing the material properties. For example, roughness or topology of the underlying structure is measured while changing the wavelength of the ICS source. For longer wavelengths, roughness information is scarcely present in the reflected illumination, while shorter wavelengths are more sensitive to the local variations in topology, such as surface roughness. It is also found that there is a threshold in the illumination wavelengths where the topology information is no longer present. Further material related information which is obtained for shorter wavelengths is the material stoichiometry, density, electrical and/or optical properties such as conductivity and capacitance.

Compared with available plasma-based EUV sources, the controllable variation in wavelength using the ICS technique will not lead to wide variations in source brightness. The trade-offs and compromises associated with known sources can be largely avoided.

Application Examples in High Volume Manufacturing

Figure 9:
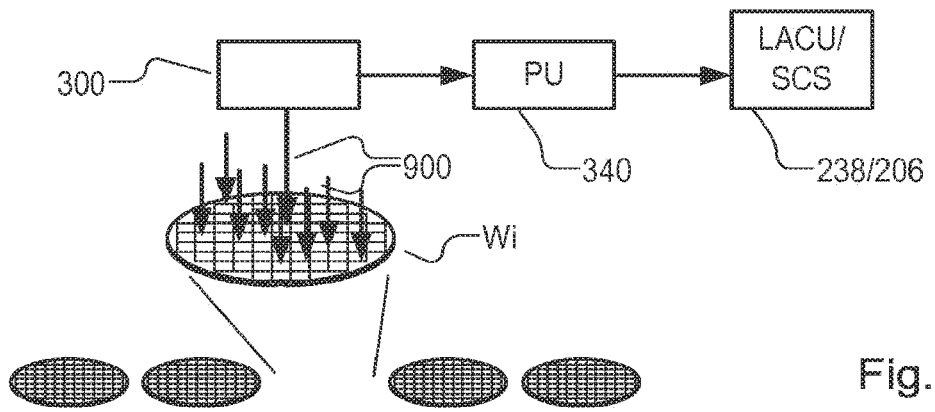
FIGS. 9 to 12 illustrate various modes of application of the apparatus of FIG. 3.

FIG. 9 illustrates a substrate W which is one of a batch or lot of wafers undergoing processing in the facility of FIG. 1. One or more scatter patterns are captured with the detector at each target location 900. The scatter patterns are used by processor 340 to calculate a measurement and reported to the operator, LACU 206 and/or SCS 238. While semiconductor substrates (wafers) are cited as a particular type of product to be measured using an inspection apparatus with an ICS source of the type described herein, it should be understood that the capabilities of the apparatus with this source are applicable in a wide range of inspection and measurement tasks.

While a target structure T in the form of a grating has been illustrated and described above, the methods enabled by the present disclosure can be adapted to are not limited to use with periodic target structures, nor to structures that are dedicated to metrology. The target structure could be part of a product structure. Product structures for this purpose includes not only structures pre-sent in a finished product, but also structures present at intermediate stages in a manufacturing process, such as a resist pattern, or a hard mask.

While a product in the form of a processed semiconductor substrate has been illustrated, another product requiring inspection is the mask or reticle that is used as a patterning device in the lithographic apparatus. The target structure may be part of such a patterning device. Inspection may be performed for quality control during and after manufacture of the patterning device. Inspection may be performed periodically during use of the patterning device, for example to detect damage or contamination.

The structures under inspection in the examples have patterns applied and structures formed in accordance with the patterns. However, the methods of the present disclosure can be applied also to inspection of blank substrates for semiconductor products or patterning devices. Inspection in that case can be for measurement of layer thicknesses or composition, and/or uniformity and/or for detection of defects such as damage and contamination.

Figure 10:
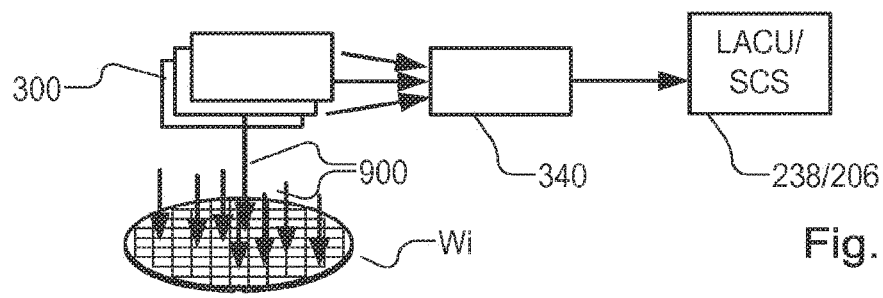

FIG. 10 illustrates the same apparatus performing an enhanced measurement method, in which multiple scatter patterns are captured with the detector at each target location, or at different target locations switching the wavelength each time. The results of these different wavelengths are combined by processor 340 into a single measurement and reported to the operator, LACU 206 and/or SCS 238. The number of different wavelengths can be as few as two, or it could be ten or more. The high brightness of the ICS source, together with the ability to switch wavelength in under a second, under half a second or even under a tenth of a second, allows these multiple measurements to be made with high throughput.

Using the example of spectroscopic reflectometry method, the purpose of the metrology techniques is to calculate measurements of one or more parameters of the shape. Applying, for example, a reconstruction technique, rigorous optical theories are used effectively to calculate what values of these parameters will result in a particular observed reflection spectrum (optionally including spectra of one or more higher diffraction orders). In other words, target shape information is obtained for parameters such as CD (critical dimension) and overlay. CD, or critical dimension, is the width of the object that is "written" on the substrate and is the limit at which a lithographic apparatus is physically able to write on a substrate. In some situations, the parameter of interest may be CD uniformity, rather than an absolute measurement of CD itself. Other parameters such as grating height and side wall angle may also be measured, if desired. Overlay metrology is a measuring system in which the overlay of two targets is measured in order to determine whether two layers on a substrate are aligned or not.

Using results from EUV metrology apparatus 300 in combination with modeling of a target structure such as the target T and its reflection and/or diffraction properties, measurement of the shape and other parameters of the structure can be performed in a number of ways. In a first type of process, a diffraction pattern based on a first estimate of the target shape (a first candidate structure) is calculated and compared with the observed reflection pattern at different wavelengths. Parameters of the model are then varied systematically and the reflection spectra re-calculated in a series of iterations, to generate new candidate structures and so arrive at a best fit. In a second type of process, reflection spectra for many different candidate structures are calculated in advance to create a 'library' of reflection spectra. Then the reflection spectrum observed from the measurement target is compared with the library of calculated spectra to find a best fit. Both methods can be used together: a coarse fit can be obtained from a library, followed by an iterative process to find a best fit. It is expected that in EUV spectroscopic reflectometry the computation for the first type of process will not be burdensome. That being the case, there would be no need to resort to a library process.

These types of process are known in principle to the skilled reader, and can be adapted to exploit the metrology apparatus 300 with ICS radiation source.

Figure 11:
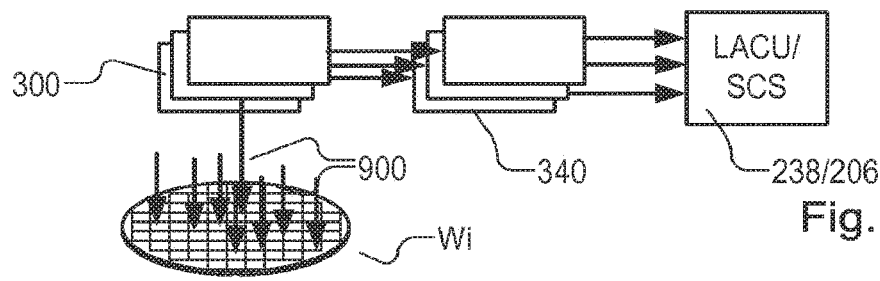

FIG. 11 illustrates the same apparatus performing a different enhanced measurement method, in which multiple scatter patterns are captured with the detector at each target location, or at different target locations switching the wavelength each time. The results of these different wavelengths are used by processor 340 to obtain different measurements of different parameters. For example, a conventional metrology target could be measured with a visible wavelength radiation, and then a product structure measured with EUV radiation. Again, the results are reported to the operator, LACU 206 and/or SCS 238.

Potentially the dedicated optical scatterometer 240 of FIG. 1 could be replaced by functions included within the EUV metrology apparatus 244.

Applications and benefits of such hybrid metrology techniques are disclosed in our European patent application 14168067.8, filed on 13 May 2014, not published at the present priority date. In that example, an optical scatterometer is used to measure one type of target, while an x-ray metrology apparatus is used to measure other targets by T-SAXS. In the present disclosure, the same source can be used for both measurements.

Figure 12:
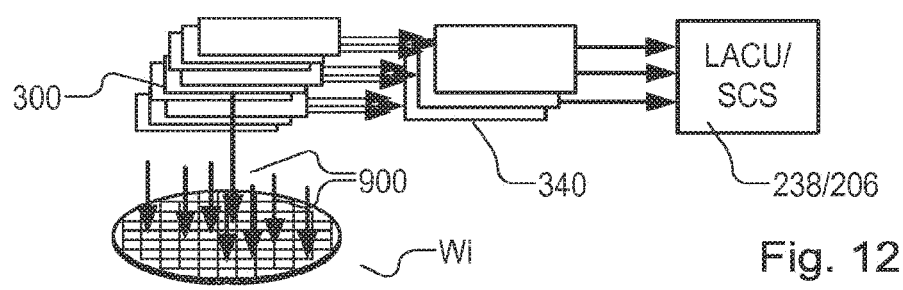

FIG. 12 illustrates a combination of the principle of FIGS. 10 and 11, in which multiple types of measurement are made on the same or different targets, each type of measurement using multiple wavelengths on the same target.

All of these different modes of operation are greatly facilitated by the provision of a high brightness source, switchable rapidly between different wavelengths across the EUV waveband and optionally over shorter and/or longer wavebands.

Figure 13:
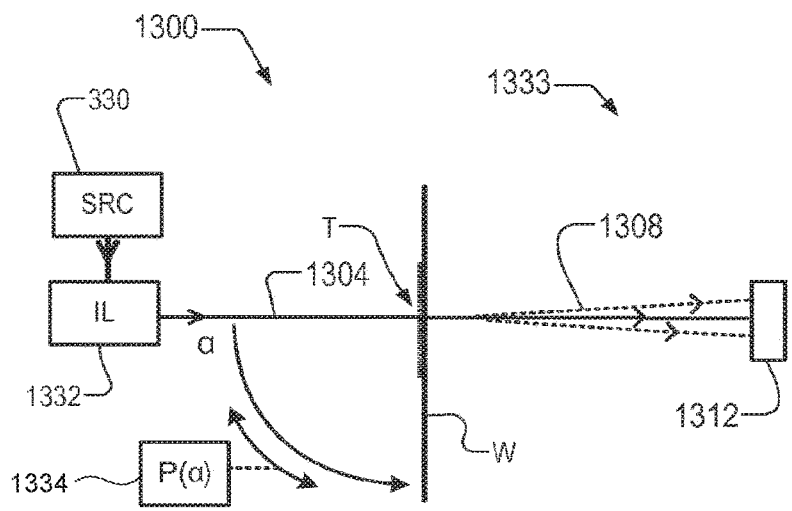
FIG. 13 illustrates a modified apparatus using an ICS source to perform transmissive small angle x-ray scatterometry.

FIG. 13 illustrates application of the source 330 in a T-SAXS metrology apparatus 1300. This is similar to the apparatus of FIG. 3, except that the substrate is presented at or near normal incidence to the radiation beam 1304, and the detected 1312 is located behind the substrate. Other reference signs beginning '13' are similar in effect to those beginning with '3' in FIG. 3. If the source generates x-rays, it can be used for T-SAXS. For silicon products, photon energies greater than 13 keV will be most effective, and currently the energy used in T-SAXS is 17 keV). However, even the energy 12.4 keV obtained in the example of Graves et at could be high enough (given the source brightness) to make T-SAXS practicable. Depending on the mechanical arrangements, potentially the positioning system 1334 could move a substrate between the reflectometry position shown in FIG. 3 and the transmission position shown in FIG. 13, within the same instrument. The detectors 340 and 1340 could be separate detectors, to simplify the mechanical design. Again a reference detector (not shown) can be provided to measure intensity of the illumination in real time.

Figure 14:
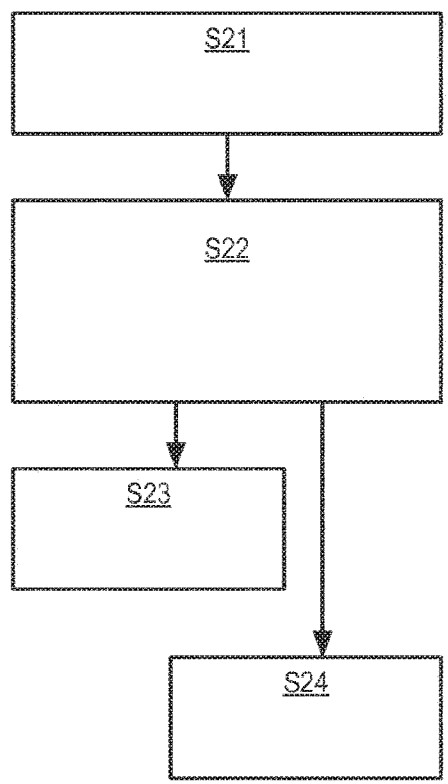
FIG. 14 is a flow chart illustrating a method of controlling performance of a metrology method and/or of a lithographic manufacturing process using measurements made by the method of FIG. 14.

FIG. 14 illustrates the application of a measurement method, for example the methods described above, in the management of a lithographic manufacturing system. The steps will be listed here, and then explained in more detail:

S21: Process wafer to produce structures on substrate
S22: Measure CD and/or other parameter across substrate
S23: Update metrology recipe
S24: Update lithography and/or process recipe At step S21, structures are produced across a substrate using the lithographic manufacturing system. At S22, the EUV metrology apparatus 244 (for example metrology apparatus 300) and optionally other metrology apparatus and information sources are used to measure a property of the structures across the substrate. At step S23, optionally, metrology recipes and calibrations of the metrology apparatus and/or other metrology apparatus 240 are updated in light of the measurement results obtained.

At step S24, measurements of CD or other parameters are compared with desired values, and used to update settings of the lithographic apparatus and/or other apparatus within the lithographic manufacturing system. By providing an EUV metrology apparatus with high volume throughput, the performance of the whole system can be improved. Product features and/or product-like features can be measured directly, even at the smallest technology nodes, and in-die targets can be provided and measured without losing too much area.

In the above steps, it is assumed that sufficient targets are measured across a substrate and across multiple substrates, that statistically reliable models of the process are derivable. The profile of CD and other parameters does not need to be expressed entirely as a variation across the substrate. It can be expressed for example as an intra-field profile that is common to all fields (each instance of patterning using the patterning device M at a different location on the substrate W) and a lower order, inter-field, variation onto which the intra-field variation is repeatedly superimposed. The settings of the lithographic process adjusted in step S24 can include intra-field settings as well as inter-field settings. They may be applicable to all operations of the apparatus, or specific to a particular product layer.

CONCLUSION

Based on the described examples metrology apparatus using a ICS-based source, the skilled reader will appreciate that the same type of source can be used in a variety of applications and metrology systems, not only EUV spectroscopic reflectometry and EUV reflectometry. For example:

- If the source generates x-rays, it can be used for T-SAXS, as already illustrated.
- GI-SAXS becomes more practicable: considering that loss of photons can be huge when trying to limit the spot size at such shallow incidence angles. The brightness and angular spread of the ICS source means that GI_SAXS may also become practicable in a high-volume environment.
- If the ICS source can be controlled to produce radiation with a sufficient spatial coherence, additional metrology technique become available. Coherent diffraction imaging (CM) method become of interest, such as ptychography. The high source brightness becomes useful, as well as the selection of wavelengths, because in ptychography (for example) multiple images have to be acquired in that technique to retrieve the phase of the scattered wave. Similarly other CDI techniques require high resolution data capture, for which high brightness is also a key enabler.
- As mentioned, radiation in VUV, DUV, UV and visible ranges can be generated by providing suitable control and power supply arrangements for the electron gun and linac.

While specific embodiments of the invention have been described above, it will be appreciated that the invention may be practiced otherwise than as described. In association with the novel targets as realized on substrates and patterning devices, an embodiment may include a computer program containing one or more sequences of machine-readable instructions describing methods of producing targets on a substrate, measuring targets on a substrate and/or processing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such computer program stored therein.

Although patterning devices in the form of a physical reticle have been described, the term "patterning device" in this application also includes a data product conveying a pattern in digital form, for example to be used in conjunction with a programmable patterning device.

Further embodiments according to the present invention are provided in below numbered clauses:

1. A method of measuring a property of a structure, the method comprising irradiating the structure at least a first time with radiation, detecting said radiation after interaction with the structure and determining a property of the structure based on a property of the radiation, wherein said radiation is generated by inverse Compton scattering, the radiation having a first wavelength in the range of 0.1 to 125 nm.
2. A method according to clause 1 wherein the structure is irradiated with said radiation using a beam diameter an extent less than 10 µm, optionally less than 5
3. A method according to clause 1 or 2 wherein the same structure is irradiated and radiation detected at least a second time, the radiation the second time being generated by inverse Compton scattering and having a second wavelength within the range 0.1 to 125 nm.
4. A method according to clause 3 wherein the property of the structure is determined based on the detected radiation of both the first and second wavelengths.
5. A method according to clause 1, 2, 3 or 4 wherein the same or a different structure is irradiated and radiation detected at least a second time, the radiation the second time being generated by inverse Compton scattering and having a second wavelength outside the range 0.1 to 125 nm.
6. A method according to clause 5 wherein the second wavelength is shorter than 0.1 nm.
7. A method according to clause 5 wherein the second wavelength is longer than 125 nm.
8. A method according to clause 5 wherein the second wavelength is longer than 200 nm.
9. A method according to clause 5 wherein the second wavelength is longer than 350 nm,
10. A method according to any of clauses 3 to 9 wherein said first and second times are completed in less than one second.
11. A method according to any preceding clause wherein said radiation is generated by delivering a beam of electrons and a beam of photons simultaneously to an interaction point.
12. A method according to clause 11 further comprising adjusting the wavelength of the radiation one or more times by adjusting an energy of electrons in the electron beam.
13. A method according to clause 11 or 12 wherein said beam of electrons is generated using an electron gun and a linear accelerator.
14. A method according to any preceding clause wherein said structure is formed on a semiconductor substrate.
15. A method according to clause 14 wherein a direction of said irradiation is greater than 2° from a direction parallel to the substrate.
16. A radiation source apparatus based on inverse Compton scattering, the apparatus comprising an electron source and a photon source, and a controller for controlling the electron source and the photon source to deliver one or more bunches of electrons to an interaction point at the same time as a pulse of photons, whereby a proportion of the photons acquire additional energy by inverse Compton scattering to and are output by the apparatus, wherein the additional energy is controllable such that the photons output by the apparatus have a wavelength in the range 0.1 nm to 125 nm.

17. An apparatus according to clause 16 wherein the additional energy is controllable such that the photons output by the apparatus have a wavelength freely selectable over at least a sub-range of the range 0.1 nm to 100 nm.

18. An apparatus according to clause 16 or 17 wherein the additional energy is further controllable such that the photons output by the apparatus at another time have a wavelength outside the range 0.1 nm to 100 nm.

19. A metrology apparatus for use in measuring properties of a structure, the apparatus comprising:
a radiation source apparatus according to any of clauses 16 to 18;
an illumination system for delivering photons output by the radiation source apparatus in a beam of radiation onto the structure; and
a detection system for detecting radiation from the structure after said photons have interacted with the structure.

20. An apparatus according to clause 19 wherein the beam of radiation when projected onto the structure has an extent less than 10 μm, optionally less than 5 μm.

21. An apparatus according to clause 19 or 20 further comprising a controller for changing the wavelength of the radiation in said radiation beam while detecting said radiation multiple times.

22. An apparatus according to clause 21 wherein the controller is operable to set a new wavelength and detect radiation at least two times in one second.

23. An apparatus according to any of clauses 19 to 22 wherein said detection system is arranged to detect said radiation after reflection from said structure.

24. An apparatus according to clauses 23 wherein the illumination system and detection system are adapted for measuring properties of structures formed at various locations on a semiconductor substrate, and wherein an incidence angle of said beam of radiation is greater than 2° relative to a surface of the substrate 25. A device manufacturing method comprising:
transferring a pattern from a patterning device onto a substrate using a lithographic process, the pattern defining at least one structure;
measuring one or more properties of the structure to determine a value for one or more parameters of the lithographic process; and
applying a correction in subsequent operations of the lithographic process in accordance with the measured property,
wherein the step of measuring the properties of the structure includes measuring a property by a method according to any of clauses 1 to 15.

26. A device manufacturing method according to clause 33 wherein said functional device pattern defines product features having a critical dimension less than 50 nm, optionally less than 20 nm.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate.

The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including the ranges identified above.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a property of a periodic structure, the method comprising:
generating a beam of radiation by inverse Compton scattering;
directing the beam at the periodic structure;
detecting radiation transmitted and diffracted by the periodic structure; and
determining the property of the periodic structure based on an asymmetry of diffraction orders of the detected radiation, and
wherein the beam has a wavelength between 0.01 to 125 nm.

2. The method of claim 1, wherein the beam has a wavelength between 5 to 125 nm.

3. The method of claim 1, wherein the beam has a wavelength between 10 to 100 nm.

4. The method of claim 1, wherein the determining comprises determining an overlay difference between a feature on a first layer of the periodic structure and a feature on a second layer of the periodic structure corresponding to the feature on the first layer generated by lithographic processes.

5. The method of claim 1, wherein the determining comprises determining one or more of damage and contamination resulting from a lithographic process.

6. The method of claim 1, wherein the determining comprises determining one or more of a structure size, a line thickness, and critical dimension generated by a lithographic process.

7. The method of claim 1, further comprising:
generating another beam of radiation by inverse Compton scattering;
directing the another beam at the periodic structure; and detecting another radiation transmitted and diffracted by the periodic structure,
wherein the another beam has a wavelength between 0.01 to 125 nm.

8. The method of claim 7, wherein the directing the beam and the another beam and the detecting the radiation and the another radiation transmitted and diffracted by the periodic structure are completed in less than one second.

9. The method of claim 1, further comprising:
generating another radiation by inverse Compton scattering;
directing the another beam at another periodic structure; and
detecting radiation transmitted and diffracted by the another periodic structure,
wherein the another beam has a wavelength between 0.01 to 125 nm.

10. The method of claim 1, wherein the generating comprises delivering a beam of electrons and a beam of photons simultaneously to an interaction point.

11. The method of claim 10, further comprising adjusting the wavelength of the beam of radiation by adjusting an energy of electrons in the beam of electrons.

12. The method of claim 10, wherein the beam of electrons is generated using an electron gun and a linear accelerator.

13. A metrology apparatus comprising:
a radiation source comprising;
an electron source configured to output electrons;
a photon source configured to output photons,
wherein the electrons and photons arrive at an interaction point simultaneously,
wherein the photons have a wavelength between 0.01 to 125 nm after undergoing inverse Compton scattering, and
wherein the radiation source is configured to output the photons;
an illumination system configured to direct the photons output by the radiation source at a periodic structure; and
a detection system configured to detect radiation transmitted and diffracted by the periodic structure,
wherein the metrology apparatus is configured to determine a property of the periodic structure based on at least an asymmetry of diffraction orders of the detected radiation.

14. The metrology apparatus of claim 13, wherein the photons have a wavelength between 5 to 125 nm after undergoing inverse Compton scattering.

15. The metrology apparatus of claim 13, wherein the photons have a wavelength between 10 to 100 nm after undergoing inverse Compton scattering.

16. The metrology apparatus of claim 13, wherein the determined property of the periodic structure comprises an overlay difference between a feature of the periodic structure and a feature on the second layer of the periodic structure corresponding to the feature on the first layer generated by lithographic processes.

17. The metrology apparatus of claim 13, wherein the determined property of the periodic structure comprises one or more of a structure size, a line thickness; a critical dimension, a layer composition, a layer thickness, damage, and contamination resulting from a lithographic process.

18. The metrology apparatus of claim 13, further comprising a controller configured to adjust an energy of the electrons to adjust the wavelength.

19. The metrology apparatus of claim 18, wherein the metrology apparatus is configured to cause, at least two times in one second, the controller to adjust the wavelength and the detector to detect the radiation transmitted and diffracted by the periodic structure.

20. A lithographic apparatus comprising:
an illumination apparatus configured to illuminate a pattern on a patterning device;
a projection system configured to project an image of the pattern onto a substrate;
a metrology apparatus comprising:
a radiation source comprising;
an electron source configured to output electrons;
a photon source configured to output photons,
wherein the electrons and photons arrive at an interaction point simultaneously,
wherein the photons have a wavelength between 0.01 to 125 nm after undergoing inverse Compton scattering, and
wherein the radiation source is configured to output the photons;
an illumination system configured to direct the photons output by the radiation source at a periodic structure; and
a detection system configured to detect radiation transmitted and diffracted by the periodic structure,
wherein the metrology apparatus is configured to determine a property of the periodic structure based on at least an asymmetry of diffraction orders of the detected radiation.

21. The method of claim 1, wherein the beam has a wavelength between 0.1 to 125 nm.

22. The metrology apparatus of claim 13, wherein the beam has a wavelength between 0.1 to 125 nm.

23. The lithographic apparatus of claim 20, wherein the beam has a wavelength between 0.1 to 125 nm.

* * * * *

UNITED STATES PATENT AND TRADEMARK OFFICE
CERTIFICATE OF CORRECTION

| | |
|---|---|
| PATENT NO. | : 10,555,407 B2 |
| APPLICATION NO. | : 16/388519 |
| DATED | : February 4, 2020 |
| INVENTOR(S) | : Polyakov et al. |

It is certified that error appears in the above-identified patent and that said Letters Patent is hereby corrected as shown below:

On the Title Page

Page 2, Line 6, item (56) References Cited – OTHER PUBLICATIONS, please replace "comparisions" with --comparisons--.

In the Claims

Column 24, Line 9, please replace "a line thickness;" with --a line thickness,--.

Signed and Sealed this
Fifth Day of May, 2020

Andrei Iancu
*Director of the United States Patent and Trademark Office*